US012040186B2

(12) United States Patent
Okumura et al.

(10) Patent No.: US 12,040,186 B2
(45) Date of Patent: Jul. 16, 2024

(54) LASER IRRADIATION APPARATUS AND LASER IRRADIATION METHOD

(71) Applicant: Samsung Display Co., Ltd., Yongin-Si (KR)

(72) Inventors: Hiroshi Okumura, Hwaseong-si (KR); Jongjun Baek, Seoul (KR); Byung Soo So, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 512 days.

(21) Appl. No.: 17/404,231

(22) Filed: Aug. 17, 2021

(65) Prior Publication Data

US 2022/0084823 A1  Mar. 17, 2022

(30) Foreign Application Priority Data

Sep. 14, 2020 (KR) .................. 10-2020-0117901

(51) Int. Cl.
| | |
|---|---|
| *B23K 26/06* | (2014.01) |
| *G02B 5/04* | (2006.01) |
| *G02B 26/10* | (2006.01) |
| *H01L 21/02* | (2006.01) |

(52) U.S. Cl.
CPC ........ *H01L 21/02691* (2013.01); *G02B 5/045* (2013.01); *G02B 26/101* (2013.01); *H01L 21/02678* (2013.01)

(58) Field of Classification Search
CPC ........ H01L 21/02691; H01L 21/02678; G02B 26/101; G02B 26/105; G02B 5/045; B23K 26/0648; B23K 26/082
See application file for complete search history.

(56) References Cited

U.S. PATENT DOCUMENTS

| | | | |
|---|---|---|---|
| 5,858,807 A | 1/1999 | Kawamura | |
| 7,679,800 B2 | 3/2010 | Yamazaki | |
| 2019/0027363 A1 | 1/2019 | Im et al. | |

FOREIGN PATENT DOCUMENTS

| | | |
|---|---|---|
| KR | 1020090119818 A | 11/2009 |
| KR | 101135535 B1 | 4/2012 |
| KR | 1020150007140 A | 1/2015 |
| KR | 101810062 B1 | 12/2017 |
| KR | 102027464 B1 | 10/2019 |
| KR | 1020200068812 A | 6/2020 |
| KR | 1020210014835 A | 2/2021 |
| KR | 1020210057248 A | 5/2021 |

*Primary Examiner* — Ryan D Howard
(74) *Attorney, Agent, or Firm* — CANTOR COLBURN LLP

(57) ABSTRACT

A laser irradiation apparatus includes a laser light source which emits a laser beam, a first lens through which the laser beam emitted from the laser light source passes, a first scanner which reflects the laser beam passing through the first lens and changes a direction of the laser beam, a second scanner which reflects the laser beam deflected by the first scanner and changes a direction of the laser beam, a plurality of second lenses through which the laser beam deflected by the second scanner passes, where at least one of the plurality of second lenses is configured to vibrate in one direction, and an optical element through which the laser beam passing through the plurality of second lenses passes, where the optical element is configured to correct an incident angle of the laser beam incident a substrate.

20 Claims, 7 Drawing Sheets

LASER IRRADIATION APPARATUS AND LASER IRRADIATION METHOD

This application claims priority to Korean Patent Application No. 10-2020-0117901 filed on Sep. 14, 2020, and all the benefits accruing therefrom under 35 U.S.C. § 119, the content of which in its entirety is herein incorporated by reference.

BACKGROUND

1. Field

Embodiments relate to a laser irradiation apparatus and a laser irradiation method, more particularly, embodiments relate to a laser irradiation apparatus used for manufacturing polysilicon and a laser irradiation method.

2. Description of the Related Art

A thin film transistor is manufactured on a substrate and is applied to an active matrix type display device. A thin film transistor using a polycrystalline semiconductor layer has an advantage of being capable of high-speed operation due to high electron mobility compared to a thin film transistor using an amorphous semiconductor film. Accordingly, a technology for forming the polycrystalline semiconductor layer having a crystal structure by crystallizing the amorphous semiconductor film formed on an insulating substrate such as glass is being studied.

As the amorphous semiconductor film crystallization method, a thermal annealing method using furnace annealing, an instantaneous annealing method, a laser annealing method, or the like are being studied, and a combination of the thermal annealing method, the instantaneous annealing method and a laser annealing method may be used. For example, the laser annealing method has an advantage of providing high energy only to the crystallization region without excessively changing the temperature of the substrate.

Typically, a pulsed laser of an excimer laser is used as a laser beam for laser annealing. As the laser usage time increases, the oscillation efficiency of the pulse decreases, causing non-uniformity of the oscillation energy and lowering the uniformity of the beam shape.

Conventionally, a crystallization process was performed by scanning a laser in the form of a line beam on an amorphous silicon layer on a substrate at a predetermined pitch.

However, the line beam generally uses a gas laser using a gas tube and the manufacturing cost and maintenance cost of the equipment were significant.

In addition, various efforts have been made to obtain a uniformly aligned polygonal grain because the size and shape of the crystal are different according to the laser irradiation method.

SUMMARY

Embodiments provide a laser irradiation apparatus vibrating a plurality of second lenses in a scan direction and disposing an optical element under the plurality of second lenses in order to reduce crystallization stains.

Embodiments provide a laser irradiation method using the laser irradiation apparatus.

A laser irradiation apparatus according to an embodiment includes a laser light source which emits a laser beam, a first lens through which the laser beam emitted from the laser light source passes, a first scanner which reflects the laser beam passing through the first lens and changes a direction of the laser beam, a second scanner which reflects the laser beam deflected by the first scanner and changes a direction of the laser beam; a plurality of second lenses through which the laser beam deflected by the second scanner passes, where at least one of the plurality of second lenses is configured to vibrate in one direction, and an optical element through which the laser beam passing through the plurality of second lenses passes, where the optical element is configured to correct an incident angle of the laser beam incident a substrate.

In embodiments, the plurality of second lenses may change an incident position to the substrate and of the laser beam deflected by the second scanner.

In embodiments, the optical element may vibrate in a direction perpendicular to the one direction.

In embodiments, a vibration period of the at least one of the plurality of second lenses and a vibration period of the optical element may be the same.

In embodiments, the plurality of second lenses may vibrate.

In embodiments, the first scanner may be a vibrable galvano mirror. The second scanner may be a rotatable polygon mirror.

In embodiments, the optical element may have a shape in which two prisms having a same shape are attached.

In embodiments, each of the prisms may be a hexahedron. The optical element may have a symmetric shape with respect to a center axis passing through a center of the optical element in a plan view and parallel to a thickness direction, and the same surface of each of the prisms may be attached to each other.

In embodiments, the optical element may be disposed under the plurality of second lenses.

In embodiments, the optical element may be formed of quartz.

A laser irradiation method according to an embodiment is provided. In the method, a laser light source emits a laser beam. The laser beam emitted from the laser light source enters the first lens. The laser beam passing through the first lens is reflected by a first scanner, and a direction of the laser beam is changed by the first scanner. The laser beam deflected by the first scanner is reflected by a second scanner, and a direction of the laser beam is changed by the second scanner. The laser beam deflected by the second scanner enters a plurality of second lenses, where at least one of the plurality of second lens vibrates in one direction. The laser beam passing through the plurality of second lenses enters on the optical element, and the optical element corrects an incident angle. The laser beam passing through the optical element is irradiated on a substrate and the substrate is scanned.

In embodiments, when the laser beam passing through the optical element may be irradiated on the substrate, a scanning position may be changed in the one direction.

In embodiments, the plurality of second lenses may change the incident position to the substrate and of the laser beam deflected by the second scanner.

In embodiments, the optical element may vibrates in a direction perpendicular to the one direction.

In embodiments, a vibration period of the at least one of the plurality of second lenses and a vibration period of the optical element may be the same.

In embodiments, the first scanner may be a vibrable galvano mirror. The second scanner may be a rotatable polygon mirror.

In embodiments, the optical element may have a shape in which two prisms having a same shape are attached.

In embodiments, each of the prisms may be a hexahedron. The optical element may have a symmetric shape with respect to a center axis passing through a center of the optical element in a plan view and parallel to a thickness direction, and the same surface of each of the prisms may be attached to each other.

In embodiments, the optical element may be disposed under the plurality of second lenses.

In embodiments, the optical element may be formed of quartz.

In a laser irradiation apparatus and a laser irradiation method according to embodiments of the present invention, an optical element may be disposed under a plurality of second lenses in order to correct an incident angle to a substrate that changes as the plurality of second lenses vibrate. Accordingly, crystallization stains that occur when crystallizing the amorphous semiconductor film may be effectively reduced and high-resolution display panel may be manufactured.

BRIEF DESCRIPTION OF THE DRAWINGS

Illustrative, non-limiting embodiments will be more clearly understood from the following detailed description taken in conjunction with the accompanying drawings.

DETAILED DESCRIPTION

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Hereinafter, laser irradiation apparatuses and laser irradiation methods in accordance with embodiments will be explained in detail with reference to the accompanying drawings.

Figure 1:
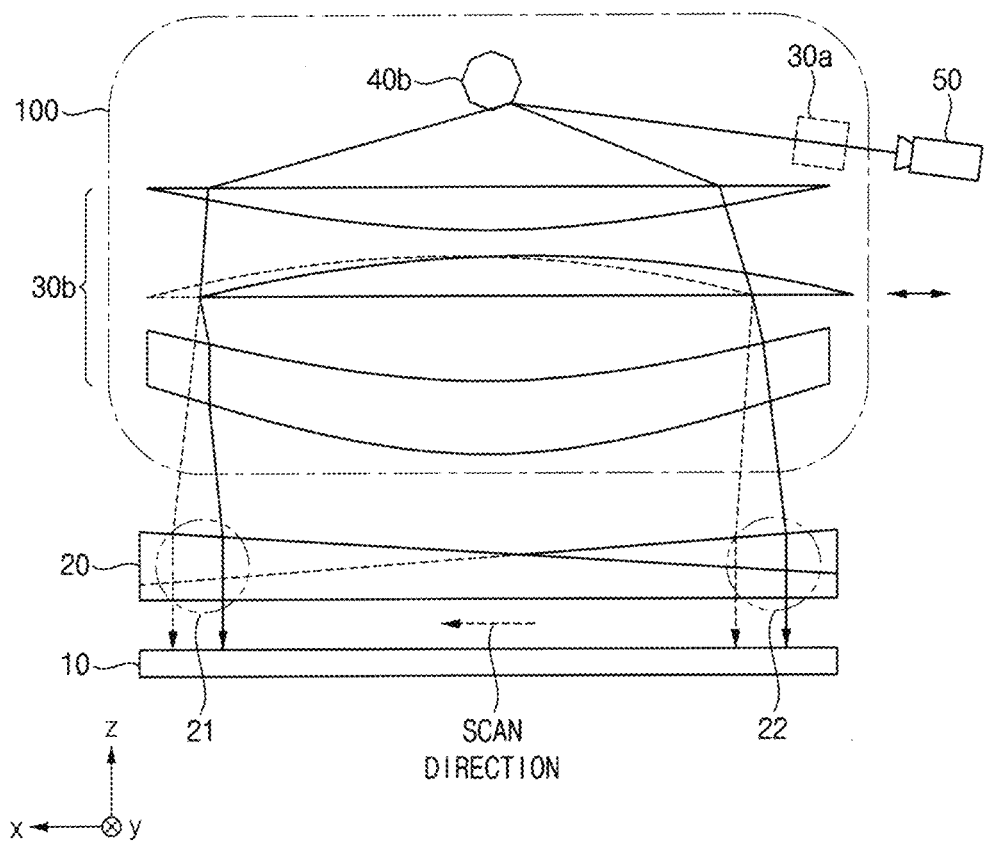
FIGS. 1 and 2 are diagrams illustrating a laser irradiation apparatus according to an embodiment.
Figure 2:
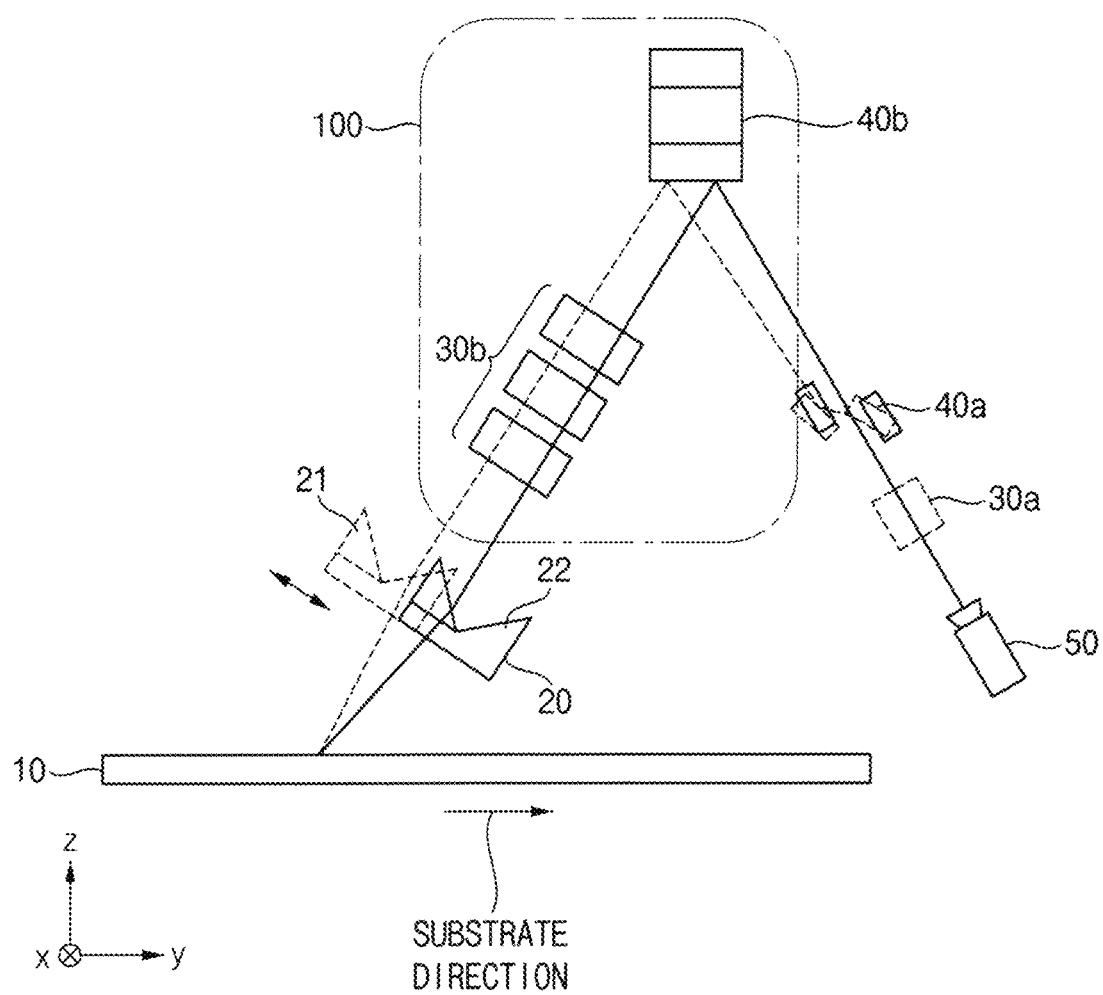

FIGS. 1 and 2 are diagrams illustrating a laser irradiation apparatus according to an embodiment.

Referring to FIGS. 1 and 2, the laser irradiation apparatus 100 may include an optical element 20, a first lens 30a, a plurality of second lenses 30b, a laser light source 50, a first scanner 40a, and a second scanner 40b. The laser irradiation apparatus 100 may irradiate a spot beam laser on the surface of the substrate 10 in a scanning manner.

The laser light source 50 may be a laser oscillator. The laser oscillator may be, for example, a continuous oscillation type laser oscillator, or a pulse oscillation type laser oscillator having a repetition frequency of about 30 megahertz (MHz) or more. For example, the laser oscillator may emit a laser beam with a 532 nanometers (nm) wavelength laser with a repetition frequency of about 30 MHz or a laser beam with a wavelength of about 355 nm. For example, when the laser oscillator uses a solid state laser of an Nd:YAG laser ("1064 nm"), the wavelength of about 532 nm may be a second harmonic wave, and the wavelength of about 355 nm may be a third harmonic wave.

The laser oscillator may use a continuous oscillation solid-state laser. Examples of the solid-state laser may include a YAG laser, a YVO4 laser, a YLF laser, a YAlO3 laser, a Y2O3 laser, a glass laser, a ruby laser, an alexandrite laser, a Ti:sapphire laser, and the like.

The laser beam emitted from the laser light source 50 may enter the first lens 30a. The first lens 30a may be an optical system for condensing light, and may be, for example, a spherical lens or a Fresnel lens. The laser beam passing through the first lens 30a may be reflected by the first scanner 40a.

The first scanner 40a may be a galvano mirror. The first scanner 40a may be plural as shown in FIG. 2. The first scanner 40a may vibrate to change a reflection angle of the laser beam (i.e., reflection angle formed by the first scanner 40a). That is, the first scanner 40a may function as a scanner that changes the direction of the reflected laser beam. In an embodiment, when the laser beam vibrates, the first scanner 40a may serve to maintain an incidence angle with respect to the substrate 10.

The laser beam deflected by the first scanner 40a may be reflected by the second scanner 40b. The second scanner 40b may be a polygon mirror. The second scanner 40b may rotate to change a reflection angle of the laser beam (i.e., reflection angle formed by the second scanner 40b). That is, the second scanner 40b may function as a scanner that changes the direction of the reflected laser beam. The second scanner 40b may be formed of or include glass or metal.

The laser beam deflected by the second scanner 40b may pass through a plurality of second lenses 30b vibrating in one direction (i.e., left-right arrow in FIG. 1). The one direction may mean a scan direction (e.g., the x direction). The scan direction may be defined as a direction in which an irradiation position of the laser beam changes on the substrate 10. The plurality of second lenses 30b may be f-theta lens. The f-theta lens may condense the laser beam so that the f-theta lens always locates focus of the laser beam on the substrate 10 that is the irradiation target. At least one of the plurality of second lenses 30b may vibrate in the scan direction. Selectively, at least one of the plurality of second lenses 30b may vibrate in a direction (e.g., the y direction or the z direction) perpendicular to the scan direction. In an embodiment, the plurality of second lenses 30b vibrating in the scan direction may change the incident position, on the substrate 10, of the laser beam deflected by the second scanner 40b.

The laser beam passing through the plurality of second lenses 30b may pass through the optical element 20. The optical element 20 may include a first region 21 and a second region 22. The first region 21 may be defined as a part having a thick left side and a thin right side in the x direction, and the second region 22 may be defined as a part having a thin left side and a thick right side in the x direction (See FIG. 4). The optical element 20 may be disposed under the plurality of second lenses 30b. When the plurality of second lenses 30b vibrate in the scan direction, an incidence angle of the laser beam to the substrate 10 may be inclined with respect to a normal direction (i.e., z direction) to a main surface plane of the substrate 10 which is defined by the x direction and y direction. When the incidence angle to the substrate 10 is inclined, the optical element 20 may vibrate in a direction (i.e., direction of the double arrow in FIG. 2) perpendicular to the scan direction, thereby may correct the incidence angle to the substrate 10. The vibration period of the plurality of second lenses 30b and the vibration period of the optical element 20 may be the same. The optical element 20 may be referred to an incident angle correction plate. In an embodiment, the optical element 20 may include or be formed of quartz. However, the present invention is not limited thereto and the optical element 20 may be formed of a different material in another embodiment.

In an embodiment, referring to FIG. 1, when the plurality of second lenses 30b moves in a direction (e.g., right direction in FIG. 1) opposite to the x direction, the incidence angle to the substrate 10 may be inclined in a counterclockwise direction. In this case, when the laser beam passes through the first region 21 of the optical element 20, the incidence angle to the substrate 10 may be corrected. Selectively, when the plurality of second lenses 30b move in the x direction (i.e., scan direction), the incident angle to the substrate 10 may be inclined in the clockwise direction. In this case, when the laser beam passes through the second region 22 of the optical element 20, the incident angle to the substrate 10 may be corrected. Selectively, when the plurality of second lenses 30b is located in the center based on the x direction, the laser beam passes through between the first region 21 and the second region 22 of the optical element 20, thus, the incidence angle to substrate 10 may be maintained.

Figure 3:
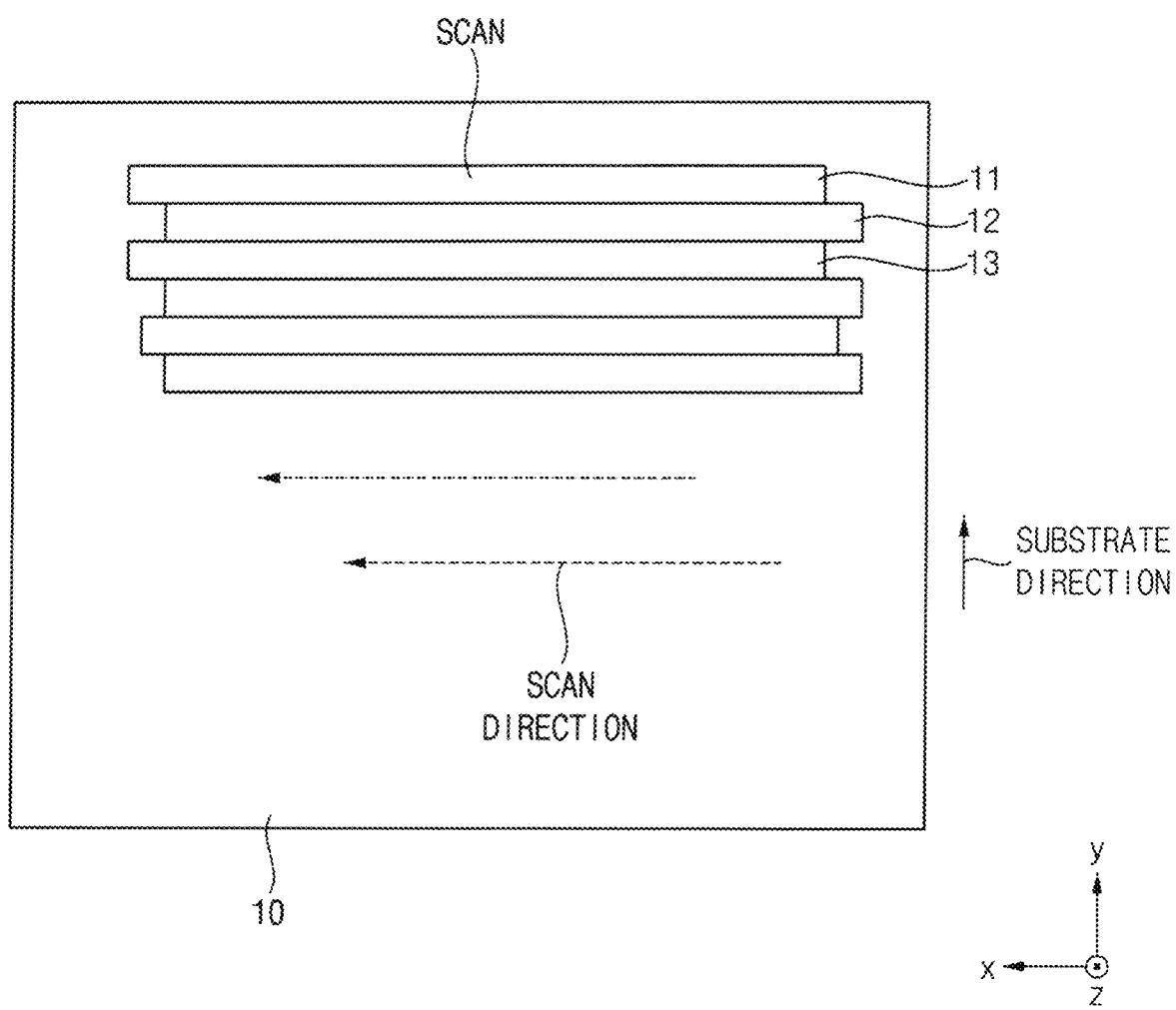
FIG. 3 is a diagram illustrating a substrate on which a laser irradiation method is performed according to an embodiment.

FIG. 3 is a diagram illustrating a substrate on which a laser irradiation method is performed according to an embodiment.

Referring to FIG. 3, a spot laser beam may be scanned in a x direction perpendicular to a y direction on a substrate 10 a plurality of times to irradiate the entire substrate 10. In this manner, the whole of the substrate 10 may be subjected to laser treatment.

According to the laser irradiation method, a laser beam may be irradiated onto a surface of the substrate 10 using the spot beam laser and the laser beam irradiation region to which the laser beam is irradiated may be changed along the x direction. That is, the laser beam may be irradiated to the first part 11 having a width in the y direction and a length in the x direction in a scan method. That is, the first part 11 has a shape extended in the x direction.

After the first part 11 is scanned, the substrate 10 may be moved a predetermined distance in the y direction (i.e., substrate direction in FIGS. 2 and 3) that is perpendicular to the scan direction (i.e., x direction). After moving the substrate 10 for the predetermined distance in the y direction, using the spot beam laser, a laser beam may be irradiated to a second part 12 having the width in the y direction and the length in the x direction in a scan method. That is, the second part 12 has a shape extended in the x direction.

After the second part 12 is scanned, the substrate 10 may be moved a predetermined distance in a y direction that is perpendicular to the scan direction. After moving the substrate 10, using the spot beam laser, a laser beam may be irradiated to a third part 13 having the width in the y direction and the length in the x direction in a scan method. That is, the third part 13 has a shape extended in the x direction.

By repeating the scan as described above while maintaining the parallelism of the scan and the incidence angle to the substrate 10 for the entire substrate 10, the crystallization region may be formed.

The substrate 10 may be any one of a Low Temperature Poly-Si ("LTPS") substrate, a glass substrate, a plastic substrate, a and a stainless still ("SUS") substrate. An amorphous silicon layer may be formed on the substrate 10, and the amorphous silicon layer may be crystallized by the laser irradiation to form polysilicon. That is, crystallization due to Near Complete Melting of the amorphous silicon may occur by the irradiated laser beam.

Figure 4:
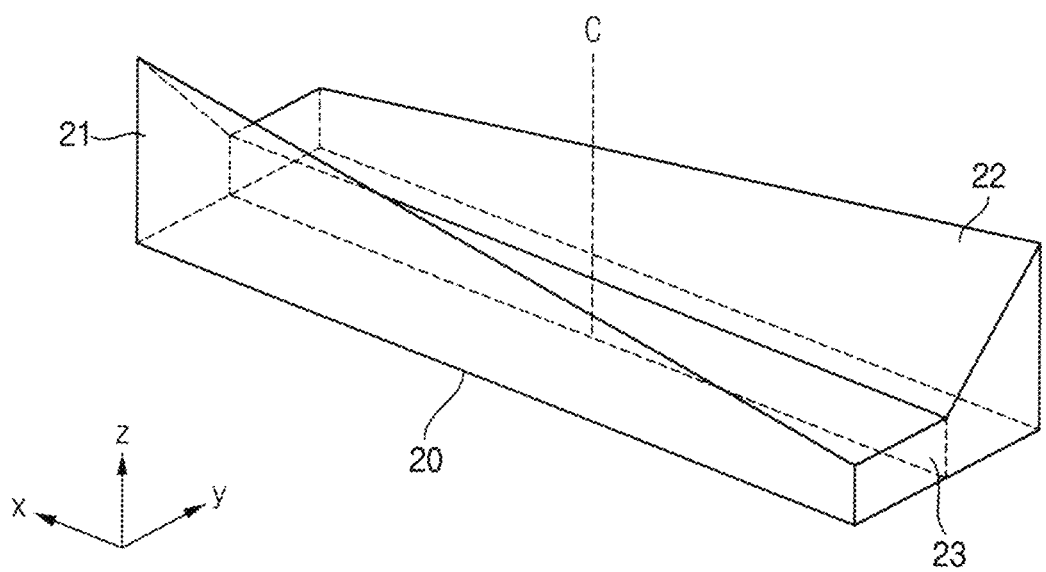
FIG. 4 is a diagram illustrating an optical element included in the laser irradiation apparatus of FIGS. 1 and 2.
Figure 5:
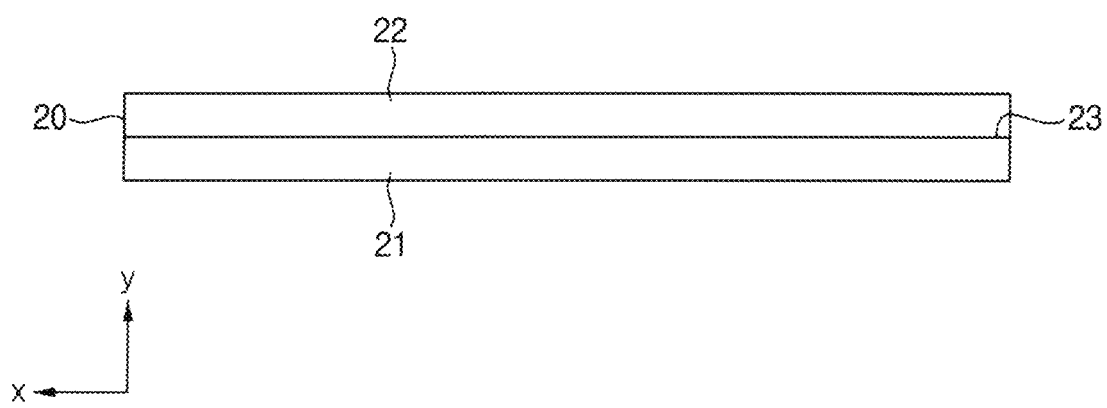
FIG. 5 is a diagram illustrating a shape of the optical element of FIG. 4 as viewed from a z direction.
Figure 6:
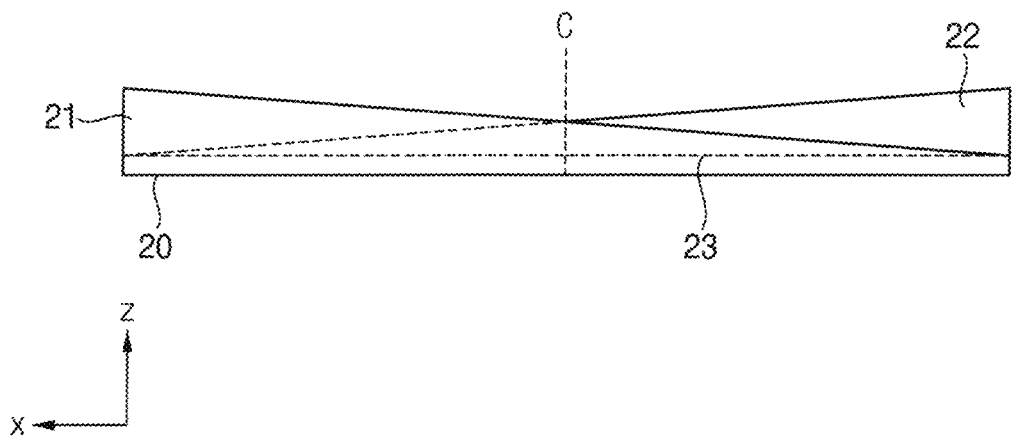
FIG. 6 is a diagram illustrating a shape of the optical element of FIG. 4 as viewed from a y direction.
Figure 7:
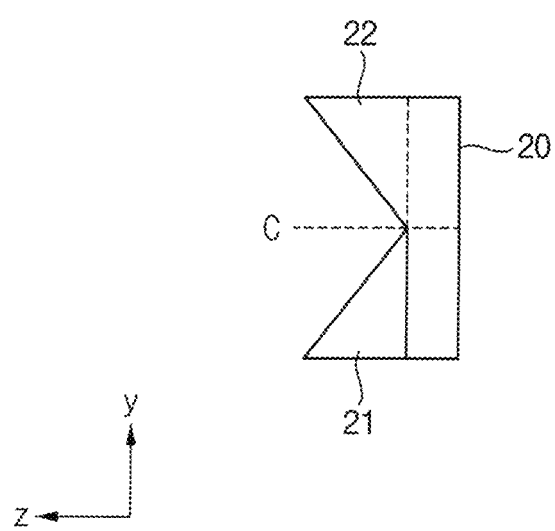
FIG. 7 is a diagram illustrating a shape of the optical element of FIG. 4 as viewed from a x direction.

FIG. 4 is a diagram illustrating an optical element included in the laser irradiation apparatus of FIGS. 1 and 2. FIG. 5 is a diagram illustrating a shape of the optical element of FIG. 4 as viewed from a z direction. FIG. 6 is a diagram illustrating a shape of the optical element of FIG. 4 as viewed from a y direction. FIG. 7 is a diagram illustrating a shape of the optical element of FIG. 4 as viewed from a x direction.

Referring to FIG. 4, the optical element 20 may have a shape in which two prisms having the same shape are attached to each other. In an embodiment, each of the prisms may be a hexahedron. For example, the hexahedron may have a different height in the z direction depending on a position of measuring the height in the plane defined by the x direction and the y direction, and the optical element 20 may have a shape in which two prisms each having one surface 23 having the same height in the z direction is attached to each other when viewed from the y direction. A cross-sectional shape including a center axis C of the optical element 20 may have a symmetrical shape with respect to the center axis C located at the center point of optical element 20 and parallel to the z direction. That is, the optical element 20 has a symmetric shape with respect to the center axis C passing through a center of the optical element 20 in a plan view (FIG. 5) and parallel to a thickness direction (i.e., the z direction) and, the same surface of each of the prisms is attached to each other.

In detail, referring to FIG. 5, the shape of the optical element 20 viewed in the z direction may be a shape in which rectangles of the same size are vertically combined. Referring FIG. 6, the shape of the optical element 20 viewed in the y direction may have a shape symmetrical with respect to the center axis C. Referring FIG. 7, the shape of the optical element 20 viewed in the x direction may have a shape symmetrical with respect to the center axis C.

Referring FIGS. 4 and 6, the optical element 20 may occur a height difference in the z direction according to the x direction.

Referring FIGS. 4 and 7, the length difference in the z direction according to the x direction may be greatest at both ends in the y direction.

Figure 8:
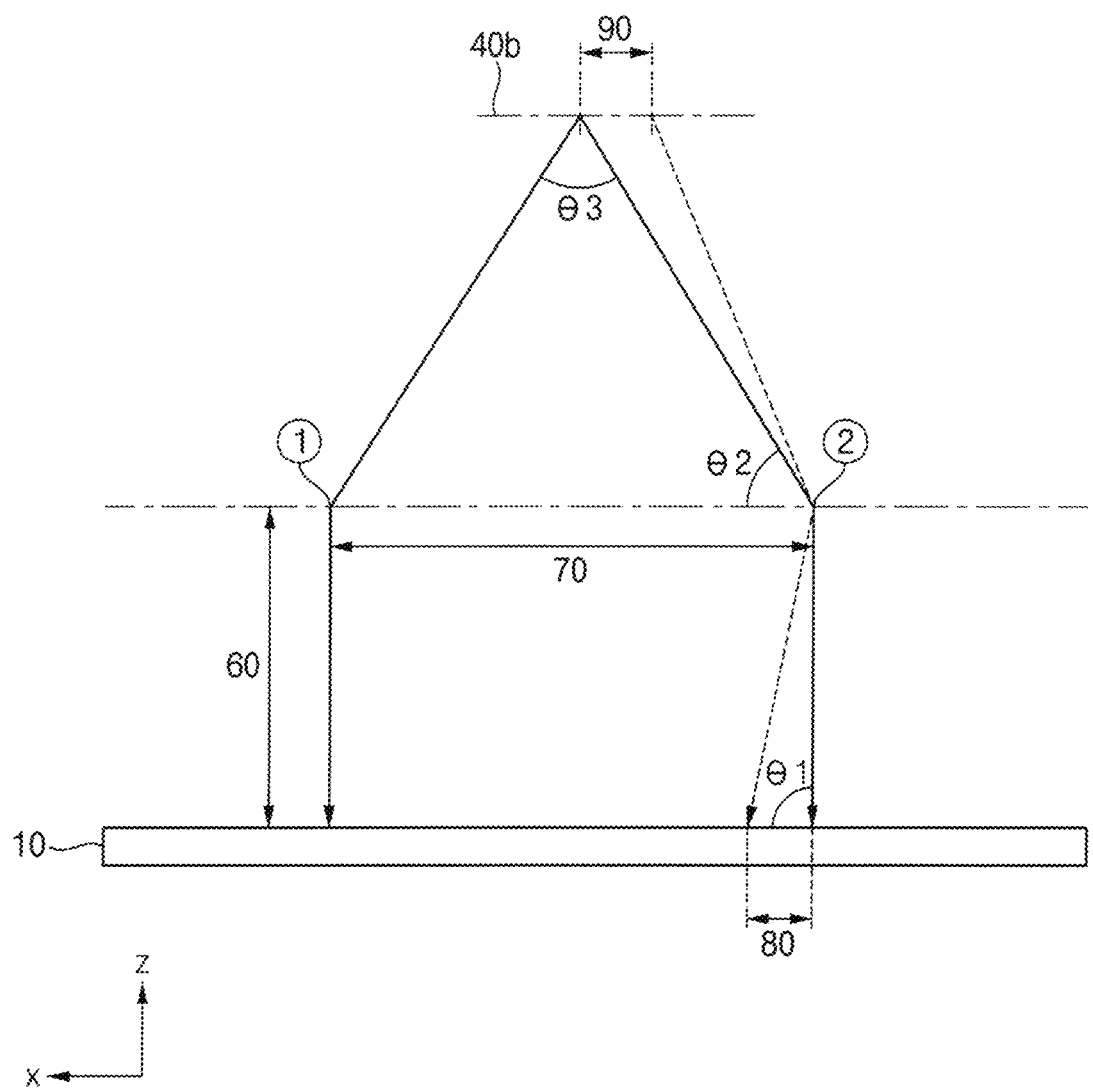
FIG. 8 is a diagram illustrating first to fourth lengths, a substrate incident angle, a lens incident angle, and a divergence angle according to the laser irradiation method.

FIG. 8 is a diagram illustrating first to fourth lengths, a substrate incident angle, a lens incident angle, and a divergence angle according to the laser irradiation method.

In FIG. 8, with respect to the substrate 10, a substrate incident angle $\theta_1$, a lens incident angle $\theta_2$, a divergence angle $\theta_3$, a first length 60, a second length 70, a third length 80, and a fourth length 90 of the laser beam emitted from the laser light source 50 may be shown.

Referring FIGS. 1, 2, and 8, the substrate incident angle $\theta_1$ may be defined as the angle of the laser beam with respect to the major surface plane of the substrate 10 at a point entering on the substrate 10 from the optical element 20. The lens incident angle $\theta_2$ may be defined as an angle of the laser beam with respect to the plane defined by the x direction and the y direction at a point entering on the plurality of second lenses 30b from the second scanner 40b. The divergence angle $\theta_3$ may be defined as the angle between the laser beam entering the part ① (i.e., first end to which the laser beam reflected from the second scanner 40b may reach) and the laser beam entering part ② (i.e., second end to which the laser beam reflected from the second scanner 40b may reach and opposite to the first end).

The first length 60 may be defined as a length between the plurality of second lenses 30b and the substrate 10. The second length 70 may be defined as a scan length that is, for example, the length of the first part 11 shown in FIG. 3 in the x direction (i.e., the scan direction). The third length 80 may be defined as the variation width of the irradiation position of the laser beam irradiated to the substrate 10 in the scan direction according to the vibration of the second lenses 30b in the scan direction in a case that there is no the optical element 20. The fourth length 90 may be defined as the width of the position variation of the second scanner 40b in the scan direction.

In an embodiment, the divergence angle $\theta_3$ of the laser beams deflected by the second scanner 40b may be about 30 degrees (°), the second length 70 may be about 600 millimeters (mm), and the first length 60 may be about 500 mm. In this case, the third length 80 may be about −0.5 mm to about 0.5 mm (here, minus means that the variation of the irradiation position occurs to a direction opposite to the x direction with respect to a reference position), and the variation of the substrate incident angle $\theta_1$ may be about −0.057 degrees to about 0.057 degrees with respect to a reference degree. In order for the variation of the substrate incident angle $\theta_1$ to be about −0.057 degrees to about 0.057 degrees, by moving the position of the second scanner 40b, the fourth length 90 may be about 2.4 mm, and accordingly, the variation of the lens incident angle $\theta_2$ may be about 0.2 degrees. Selectively, instead of moving the position of the second scanner 40b, the plurality of second lenses 30b may be moved by about 2.4 mm in the scan direction, and the variation of the lens incident angle $\theta_2$ may be about 0.2 degrees, accordingly.

As described above, in order to correct the changed substrate incident angle $\theta_1$, the following optical element 20 may be desirable.

Figure 9:
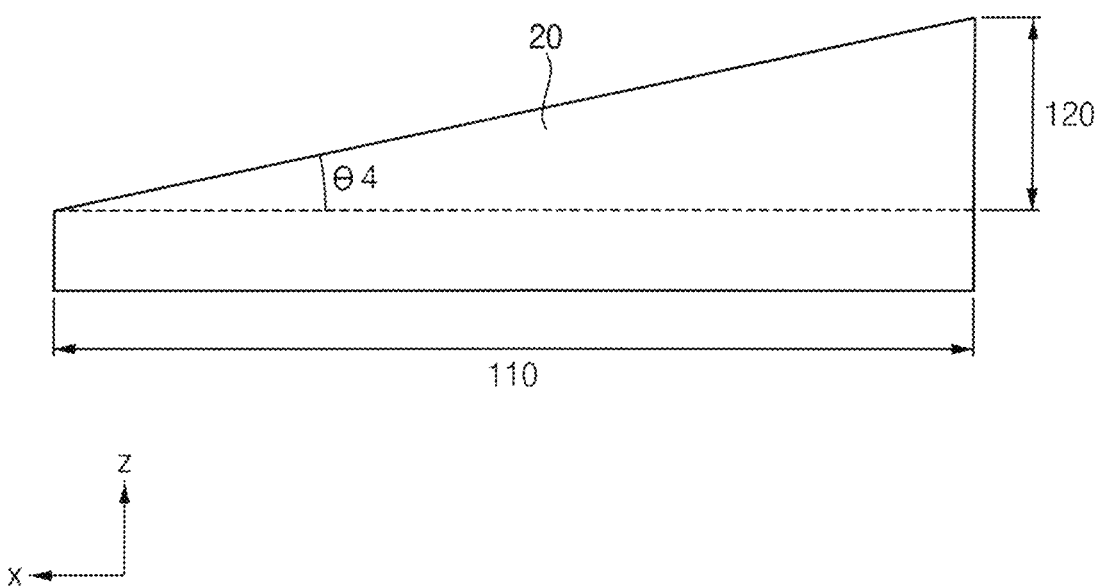
FIG. 9 is a diagram illustrating an angle, a length and a thickness of the optical element included in the laser irradiation apparatus of FIGS. 4, 5, 6, and 7.

FIG. 9 is a diagram illustrating the angle, length and height of the optical element included in the laser irradiation apparatus of FIGS. 4 to 7.

In FIG. 9, an angle $\theta_4$, a long length 110, and a height difference 120 of the optical element 20 may be shown.

Referring to FIG. 9, the height difference 120 may be defined as a difference in height between opposite ends of a prism in the x direction. The long length 110 may be defined as the length of one prism of the optical element of FIG. 5 in the x direction. The angle $\theta_4$ may be defined as $\tan^{-1}$ (the height difference 120/the length 110).

In an embodiment, as shown in FIG. 8, when the divergence angle $\theta_3$ is 30 degrees, the first length 60 is about 500 mm, and the second length 70 is about 600 mm, the third length 80 may be about −0.5 mm to about 0.5 mm due to the plurality of second lenses 30b vibrating in the scan direction in a case that the laser irradiation apparatus 100 does not include the optical element 20. As described above, when the third length 80 is about −0.5 mm to about 0.5 mm, the variation of the substrate incident angle $\theta_1$ may be about −0.057 degrees to about 0.057 degrees. In this case, in order to correct the variation of the substrate incident angle $\theta_1$ to zero degree, the optical element 20 may be disposed.

When the optical element 20 is disposed according to an embodiment, in order to correct the variation of the substrate incident angle $\theta_1$ of about −0.057 degrees to about 0.057 degrees, the height difference 120 of the optical element 20 may be about 1.14 mm, the long length 110 of the optical element 20 may be about 620 mm, and the angle $\theta_4$ of the optical element 20 may be about 0.106 degrees. However, the length 110 and the height difference 120 according to the invention are not limited thereto and may have various values as long as the angle $\theta_4$ is about 0.106 degrees. Accordingly, by correcting the incident angle of the laser beam irradiated to the substrate, crystallization stains occurring on the display panel may be reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A laser irradiation apparatus comprising:
   a laser light source which emits a laser beam;
   a first lens through which the laser beam emitted from the laser light source passes;
   a first scanner which reflects the laser beam passing through the first lens and changes a direction of the laser beam;

a second scanner which reflects the laser beam deflected by the first scanner and changes a direction of the laser beam;
a plurality of second lenses through which the laser beam deflected by the second scanner passes, wherein at least one of the plurality of second lenses is configured to vibrate in one direction; and
an optical element through which the laser beam passing through the plurality of second lenses passes, wherein the optical element is configured to correct an incident angle of the laser beam incident a substrate.

2. The laser irradiation apparatus of claim 1, wherein the plurality of second lenses changes an incident position to the substrate and of the laser beam deflected by the second scanner.

3. The laser irradiation apparatus of claim 1, wherein the optical element vibrates in a direction perpendicular to the one direction.

4. The laser irradiation apparatus of claim 3, wherein a vibration period of the at least one of the plurality of second lenses and a vibration period of the optical element are the same.

5. The laser irradiation apparatus of claim 1, wherein the plurality of second lenses vibrates.

6. The laser irradiation apparatus of claim 1, wherein the first scanner is a vibrable galvano mirror, and
wherein the second scanner is a rotatable polygon mirror.

7. The laser irradiation apparatus of claim 1, wherein the optical element has a shape in which two prisms having a same shape are attached.

8. The laser irradiation apparatus of claim 7, wherein each of the prisms is a hexahedron, and
wherein the optical element has a symmetric shape with respect to a center axis passing through a center of the optical element in a plan view and parallel to a thickness direction, and a same surface of each of the prisms is attached to each other.

9. The laser irradiation apparatus of claim 1, wherein the optical element is disposed under the plurality of second lenses.

10. The laser irradiation apparatus of claim 1, wherein the optical element is formed of quartz.

11. A laser irradiation method comprising:
emitting a laser beam from a laser light source;
passing the laser beam emitted from the laser light source through a first lens;
reflecting the laser beam passing through the first lens in a first scanner and changing a direction of the laser beam;
reflecting the laser beam deflected by the first scanner in a second scanner and changing a direction of the laser beam;
passing the laser beam deflected by the second scanner through a plurality of second lenses, wherein at least one of the plurality of second lenses vibrates in one direction;
correcting an incidence angle to a substrate and of the laser beam passing through the plurality of second lenses by an optical element; and
scanning the substrate by irradiating the laser beam passing through the optical element.

12. The laser irradiation method of claim 11, wherein when the laser beam passing through the optical element is irradiated onto the substrate, a scanning position is changed in the one direction.

13. The laser irradiation method of claim 11, wherein the plurality of second lenses changes the incident position to the substrate and of the laser beam deflected by the second scanner.

14. The laser irradiation method of claim 11, wherein the optical element vibrates in a direction perpendicular to the one direction.

15. The laser irradiation method of claim 14, wherein a vibration period of the at least one of the plurality of second lenses and a vibration period of the optical element are the same.

16. The laser irradiation method of claim 11, wherein the first scanner is a vibrable galvano mirror, and
wherein the second scanner is a rotatable polygon mirror.

17. The laser irradiation method of claim 11, wherein the optical element has a shape in which two prisms having a same shape are attached.

18. The laser irradiation method of claim 11, wherein each of the prisms is a hexahedron, and
wherein the optical element has a symmetric shape with respect to a center axis passing through a center of the optical element in a plan view and parallel to a thickness direction, and a same surface of each of the prisms is attached to each other.

19. The laser irradiation method of claim 11, wherein the optical element is disposed under the plurality of second lenses.

20. The laser irradiation method of claim 11, wherein the optical element is formed of quartz.

* * * * *